(12) United States Patent
Lee et al.

(10) Patent No.: US 8,471,581 B2
(45) Date of Patent: Jun. 25, 2013

(54) APPARATUS AND METHOD FOR INSPECTING DEFECTS IN CIRCUIT PATTERN OF SUBSTRATE

(75) Inventors: Seung Seoup Lee, Gyunggi-do (KR); Soon Gyu Yim, Gyunggi-do (KR); In Kyung Park, Daejeon (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 359 days.

(21) Appl. No.: 12/710,937

(22) Filed: Feb. 23, 2010

(65) Prior Publication Data

US 2011/0115516 A1   May 19, 2011

(30) Foreign Application Priority Data

Nov. 16, 2009   (KR) .................. 10-2009-0110279

(51) Int. Cl.
   *G01R 31/00*   (2006.01)
(52) U.S. Cl.
   USPC ..................................................... 324/755.11
(58) Field of Classification Search
   None
   See application file for complete search history.

(56) References Cited

U.S. PATENT DOCUMENTS

| | | | | |
|---|---|---|---|---|
| 8,034,641 | B2 * | 10/2011 | Ko et al. | 438/16 |
| 8,111,389 | B2 * | 2/2012 | Lee et al. | 324/73.1 |
| 2002/0166964 | A1 * | 11/2002 | Talbot et al. | 250/307 |
| 2005/0200841 | A1 * | 9/2005 | Talbot et al. | 356/237.4 |
| 2011/0128011 | A1 * | 6/2011 | Lee et al. | 324/501 |

FOREIGN PATENT DOCUMENTS

| | | | |
|---|---|---|---|
| JP | 10282179 A | * | 10/1998 |
| JP | 2000-232141 | | 8/2000 |
| JP | 2003-084026 | | 3/2003 |
| JP | 2006-105937 | | 4/2006 |
| KR | 2004-38221 A | | 5/2004 |

OTHER PUBLICATIONS

English translation of JP 10-282179 filed of Oct. 23, 1998.*
Office Action from counterpart Korean Patent Application No. 10-2009-0110279, Mar. 31, 2011, 5 pages.
Office Action from counterpart Japanese Patent Application No. 2010-036584, mailed Jul. 17, 2012 ,4 pages, English Summary included.

* cited by examiner

*Primary Examiner* — Jermele M Hollington
(74) *Attorney, Agent, or Firm* — Blakely Sokoloff Taylor & Zafman, LLP

(57) ABSTRACT

Disclosed herein is an apparatus and method for inspecting defects in the circuit pattern of a substrate. The apparatus for inspecting defects in a circuit pattern of a substrate includes a pin probe configured to input a voltage while coming into contact with an inspection target circuit pattern of a substrate. A capacitor sensor is provided with a membrane electrode which is opposite a connection circuit pattern to be electrically connected to the inspection target circuit pattern in a non-contact manner, and is configured to detect both capacitance and capacitance variation, generated due to displacement of the membrane electrode attributable to electrostatic attractive force acting from the connection circuit pattern on the membrane electrode. A capacitance measurement unit is connected to the capacitor sensor and is configured to measure capacitance attributable to the displacement of the membrane electrode, which is input from the capacitor sensor.

8 Claims, 4 Drawing Sheets

APPARATUS AND METHOD FOR INSPECTING DEFECTS IN CIRCUIT PATTERN OF SUBSTRATE

CROSS REFERENCE TO RELATED APPLICATION

This application claims the benefit of Korean Patent Application No. 10-2009-0110279, filed on Nov. 16, 2009, entitled "Inspection Apparatus and Method for Circuit Pattern of Substrate", which is hereby incorporated by reference in its entirety into this application.

BACKGROUND OF THE INVENTION

1. Technical Field

The present invention relates to an apparatus and method for inspecting defects in the circuit pattern of a substrate.

2. Description of the Related Art

With the recent development of the electronics industry, the requirement that electronic parts be of high functionality has rapidly increased, and thus methods of inspecting the electrical characteristics of substrates when substrates are manufactured are also required to be of high precision, high speed and low cost. Meanwhile, although the requirements for high-speed measurement ensuring high reliability are strict, there is no efficient measurement method satisfying such requirements, and thus contact probe methods are currently being performed.

FIG. 1 is a sectional view showing a conventional apparatus for inspecting defects in a circuit pattern using contact pin probes. Hereinafter, a conventional apparatus and method for inspecting defects in a circuit pattern will be described with reference to FIG. 1.

The conventional apparatus for inspecting defects in a circuit pattern includes two pin probes 11 and 12, a voltage source 13 and an ammeter 14.

The first pin probe 11 is installed to come into contact with the inspection target circuit pattern 16 of a substrate 15, and inputs a voltage received from the voltage source 13 to the inspection target circuit pattern 16. Therefore, a conical portion of the first pin probe 11 is connected to the inspection target circuit pattern 16, and the portion of the first pin probe 11 which is opposite the conical portion is connected to the voltage source 13 through the lead wire of the first pin probe 11.

The second pin probe 12 is installed to come into contact with a connection circuit pattern 17, of which the electrical connection with the inspection target circuit pattern 16 is desired to be examined. Therefore, a conical portion of the second pin probe 12 is connected to the connection circuit pattern 17, and the portion of the second pin probe 12 which is opposite the conical portion is connected to the lead wire of the first pin probe 11.

The ammeter 14 is a component for measuring current flowing through a closed circuit, and is installed in series with lead wires connected to the first pin probe 11 and the second pin probe 12.

A conventional method of inspecting defects in a circuit pattern is described below.

When the inspection target circuit pattern 16 is normally connected to the connection circuit pattern 17, current flows from the voltage source 13 sequentially through the first pin probe 11, the inspection target circuit pattern 16, the connection circuit pattern 17, and the second pin probe 12. The current is measured by the ammeter 14, and the entire resistance can be measured by applying the current to the formula of Ohm's law, that is, $R=V/I$. Theoretically, when the inspection target circuit pattern 16 is normally connected to the connection circuit pattern 17, the resistance must be '0'. However, since there are resistances of the lead wires and the pin probes 11 and 12 themselves, the entire resistance is not '0' and is derived as a relatively small value.

In contrast, when the inspection target circuit pattern 16 is not normally connected to the connection circuit pattern 17, current does not flow through a closed circuit, and the resistance becomes infinite.

Accordingly, the above resistances are compared with each other, and thus whether defects are present in the circuit pattern can be examined.

However, as described above, in the case when the contact pin probes 11 and 12 are used both in the inspection target circuit pattern 16 and in the connection circuit pattern 17, even if the circuit patterns are not normally connected, the circuit patterns may be measured as if they were normally connected to each other due to the contact pressure of the pin probes 11 and 12. That is, there is a problem in that the occurrence of erroneous measurements may increase.

Further, there is a problem in that the pin probes 11 and 12 come into contact with all unit circuit patterns, thus increasing measurement time.

SUMMARY OF THE INVENTION

Accordingly, the present invention has been made keeping in mind the above problems occurring in the prior art, and the present invention is intended to provide an apparatus for inspecting defects in the circuit pattern of a substrate, in which a capacitor sensor is installed with respect to a connection circuit pattern in a non-contact manner, thus reducing the occurrence of erroneous measurements.

Further, the present invention is intended to provide an apparatus for inspecting defects in the circuit pattern of a substrate, in which a capacitor sensor is installed with respect to a connection circuit pattern in a non-contact manner, thus reducing the time required for measurements.

In accordance with an aspect of the present invention, there is provided an apparatus for inspecting defects in a circuit pattern of a substrate, comprising a pin probe configured to input a voltage while coming into contact with an inspection target circuit pattern of a substrate, a capacitor sensor provided with a membrane electrode which is opposite a connection circuit pattern to be electrically connected to the inspection target circuit pattern in a non-contact manner, and configured to detect both capacitance and capacitance variation, generated due to displacement of the membrane electrode attributable to electrostatic attractive force acting from the connection circuit pattern on the membrane electrode, and a capacitance measurement unit connected to the capacitor sensor and configured to measure capacitance attributable to the displacement of the membrane electrode, which is input from the capacitor sensor.

In an embodiment, the apparatus further comprises a voltage source for applying the voltage to the inspection target circuit pattern through the pin probe.

In an embodiment, the displacement of the membrane electrode of the capacitor sensor occurs towards the connection circuit pattern due to electrostatic attractive force when the inspection target circuit pattern of the substrate is electrically connected to the connection circuit pattern.

In an embodiment, the substrate is a printed circuit board or a semiconductor wafer.

In an embodiment, the membrane electrode of the capacitor sensor has a size identical to that of the connection circuit pattern of the substrate.

In accordance with another aspect of the present invention, there is provided a method of inspecting defects in a circuit pattern of a substrate, comprising (A) preparing a pin probe which inputs a voltage while coming into contact with an inspection target circuit pattern of a substrate, (B) disposing a capacitor sensor on the substrate so that a membrane electrode provided on the capacitor sensor is opposite a connection circuit pattern to be electrically connected to the inspection target circuit pattern in a non-contact manner, and (C) inputting the voltage to the inspection target circuit pattern of the substrate through the pin probe, and measuring capacitance attributable to displacement of the membrane electrode detected by the capacitor sensor.

In an embodiment, the method further comprises (D) determining based on a difference in the measured capacitance whether defects are present in the circuit pattern of the substrate.

In an embodiment, a capacitor of the capacitor sensor comprises two conductor films respectively implemented as the membrane electrode and the connection circuit pattern, and a dielectric implemented as an air layer between the membrane electrode and the connection circuit pattern.

In an embodiment, at (C), the displacement of the membrane electrode of the capacitor sensor occurs towards the connection circuit pattern due to electrostatic attractive force when the inspection target circuit pattern of the substrate is electrically connected to the connection circuit pattern.

In an embodiment, the substrate is a printed circuit board or a semiconductor wafer.

In an embodiment, the inspection target circuit pattern and the connection circuit pattern of the substrate are connected to each other through a via.

In an embodiment, the membrane electrode of the capacitor sensor has a size identical to that of the connection circuit pattern.

DESCRIPTION OF THE PREFERRED EMBODIMENTS

Figure 1:
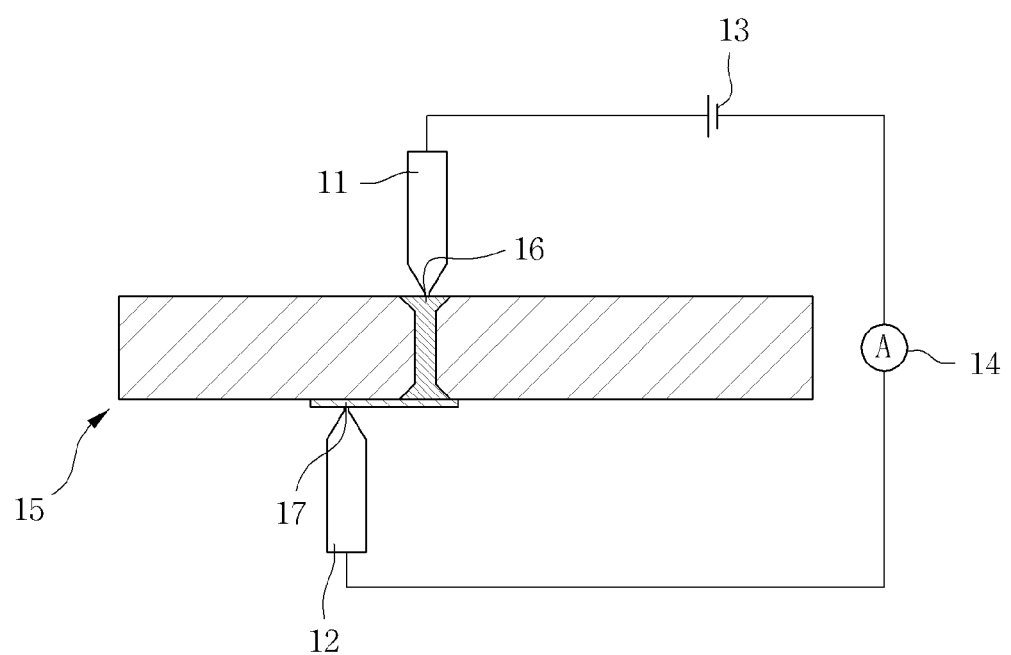
FIG. 1 is a sectional view showing a conventional apparatus for inspecting defects in a circuit pattern using pin probes.

Prior to giving the description, the terms and words used in the present specification and claims should not be interpreted as being limited to their typical meaning based on the dictionary definitions thereof, but should be interpreted to have the meaning and concept relevant to the technical spirit of the present invention, on the basis of the principle by which the inventor can suitably define the implications of terms in the way which best describes the invention.

The above and other objects, features and advantages of the present invention will be more clearly understood from the following detailed description taken in conjunction with the accompanying drawings. In the present specification, reference now should be made to the drawings, in which the same reference numerals are used throughout the different drawings to designate the same or similar components. Further, the above terms are used to distinguish one component from the other component, and the components of the present invention are not limited by the terms. Further, in the description of the present invention, if detailed descriptions of related well-known constructions or functions are determined to make the gist of the present invention unclear, the detailed descriptions will be omitted.

Hereinafter, embodiments of the present invention will be described in detail with reference to the attached drawings.

Figure 2:
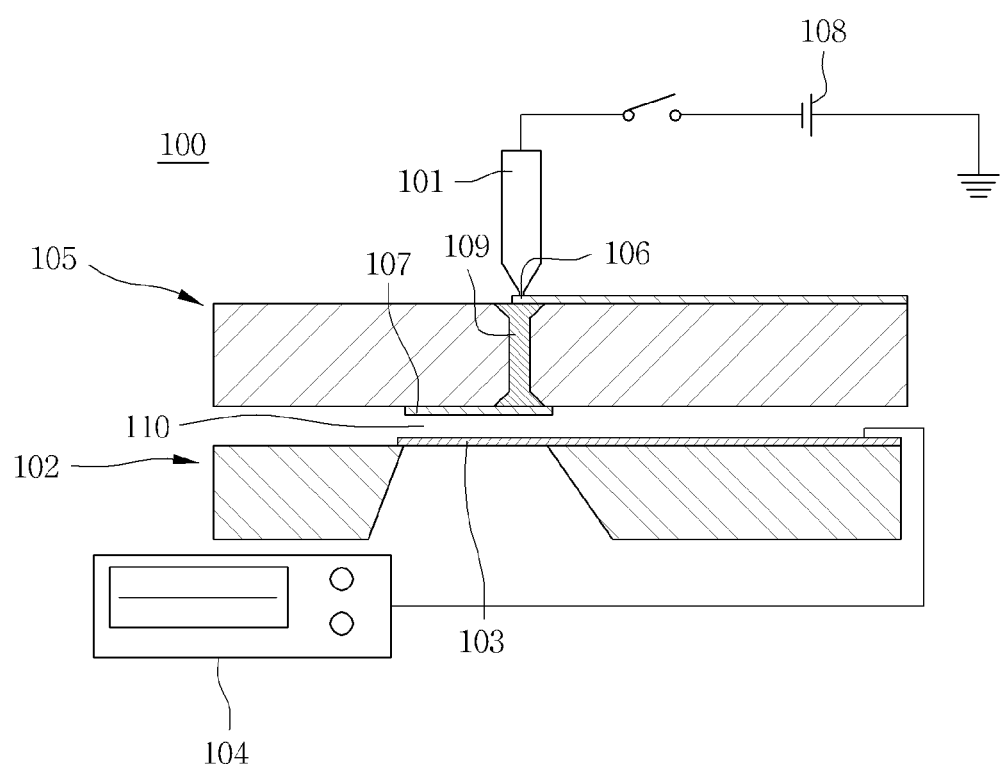
FIG. 2 is a sectional view showing an apparatus for inspecting defects in the circuit pattern of a substrate according to an embodiment of the present invention.

Structure of an Apparatus for Inspecting Defects in the Circuit Pattern of a Substrate FIG. 2 is a sectional view showing an apparatus 100 for inspecting defects in the circuit pattern of a substrate according to the present invention. Hereinafter, the apparatus 100 for inspecting defects in the circuit pattern of a substrate according to the present invention will be described in detail.

As shown in FIG. 2, the apparatus 100 for inspecting defects in the circuit pattern of a substrate includes a pin probe 101 for inputting a voltage, a capacitor sensor 102 provided with a membrane electrode 103, and a measurement unit 104 for measuring capacitance.

The pin probe 101 comes into contact with the inspection target circuit pattern 106 of a substrate 105, and functions to input an externally applied voltage to the inspection target circuit pattern 106 and to generate a potential difference.

The pin probe 101 has a micro-pin structure, and is implemented as a conductor to input the externally applied voltage to the inspection target circuit pattern 106 of the substrate 105. Further, in order to minimize electric resistance attributable to the pin probe 101 itself, the surface of the pin probe 101 is plated with metal having low electrical resistance and high surface hardness, for example, an expensive noble metal such as gold or rhodium.

The pin probe 101 is formed in the shape of a cylinder, and, in particular, a portion thereof coming into contact with the inspection target circuit pattern 106 of the substrate 105 is formed in a conical shape corresponding to a fine circuit pattern. However, the shape of the section of the pin probe 101 is not limited to a circle, but may be the shape of a polygon such as a triangle or a rectangle.

The conical portion of the pin probe 101 comes into contact with the inspection target circuit pattern 106 of the substrate 105, and the portion of the pin probe 101 which is opposite the conical portion is connected to a lead wire, and is then connected to an external voltage source 108 through the lead wire.

The capacitor sensor 102 includes the membrane electrode 103, and detects whether the displacement of the membrane electrode 103 has occurred due to electrostatic attractive force acting on the membrane electrode 103. In particular, the capacitor sensor 102 is installed to be opposite the connection circuit pattern 107 in a non-contact manner.

The capacitor of the capacitor sensor 102 is composed of a first metal plate implemented as the membrane electrode 103, a second metal plate implemented as the connection circuit pattern 107, of which the electrical connection with the inspection target circuit pattern 106 is desired to be examined, and a dielectric implemented as an air layer 110 between the membrane electrode 103 and the connection circuit pattern 107.

The membrane electrode 103 is a thin film made of metal, or a film in which a thin metal film is applied to another substrate, and is formed to be opposite the connection circuit pattern 107 in a non-contact manner. When the inspection target circuit pattern 106 is normally connected to the connection circuit pattern 107, the membrane electrode 103 is drawn and curved towards the connection circuit pattern 107 due to the action of electrostatic attractive force. That is, the displacement of the membrane electrode 103 occurs.

Meanwhile, since the capacitor sensor 102 is installed with respect to the connection circuit pattern 107 in a non-contact manner, and does not apply contact pressure to the connection circuit pattern 107, the concealment of the separation of electrodes as in conventional contact methods does not occur, and the possibility of the occurrence of erroneous measurements caused by the concealment of the separation of electrodes decreases. Further, there is no need to come into contact with unit circuit patterns, so that fine circuit patterns can also be precisely measured.

The measurement unit 104 is a component for receiving from the capacitor sensor 102 information about whether the displacement of the membrane electrode 103 has occurred, and then measuring variations in the capacitance of the capacitor attributable to the displacement of the membrane electrode 103. The measurement unit 104 is connected to the capacitor sensor 102. A detailed method of measuring capacitance will be described in detail in the method of inspecting defects in the circuit pattern of a substrate, which will be described later.

The substrate 105 is not a component of the apparatus 100 for inspecting defects in the circuit pattern of a substrate according to the present invention, but is an object to be inspected. The substrate 105 includes the inspection target circuit pattern 106, the connection circuit pattern 107, and an insulating layer, and may include a semiconductor wafer as well as a printed circuit board.

As described above, the apparatus of FIG. 2 for inspecting defects in the circuit pattern of a substrate is composed of the pin probe 101, the capacitor sensor 102, and the measurement unit 104.

Method of Inspecting Defects in the Circuit Pattern of a Substrate

Figure 3:
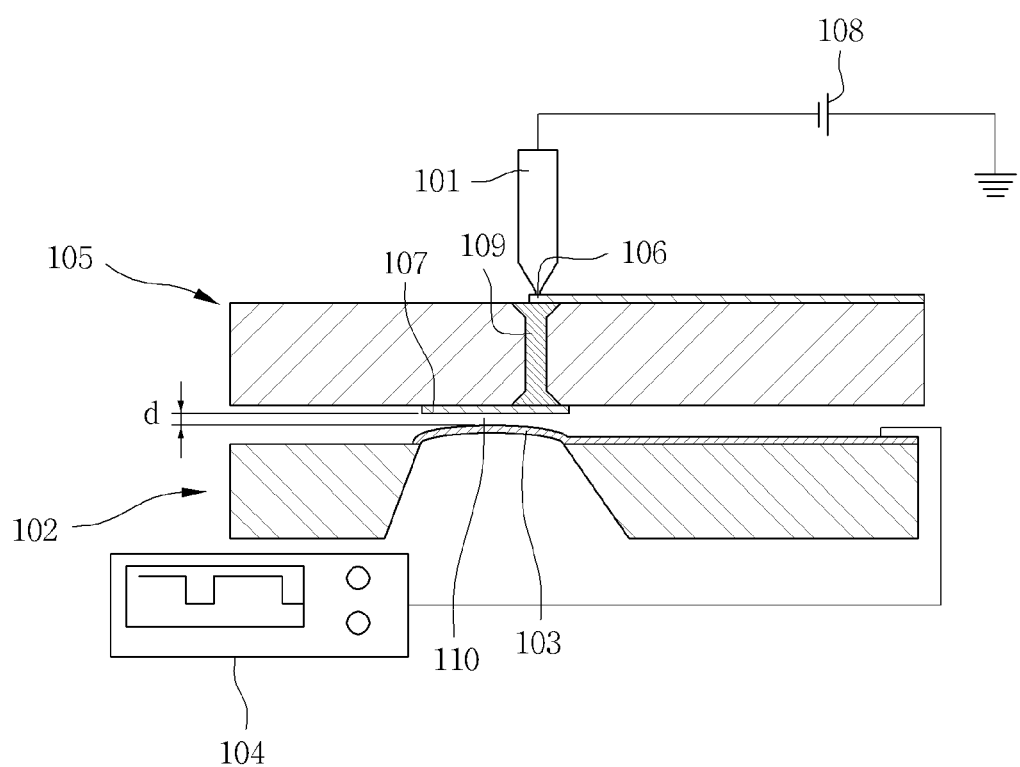
FIG. 3 is a sectional view showing an apparatus for inspecting defects in the circuit pattern of a substrate when an inspection target circuit pattern is normally connected to a connection circuit pattern according to an embodiment of the present invention.
Figure 4:
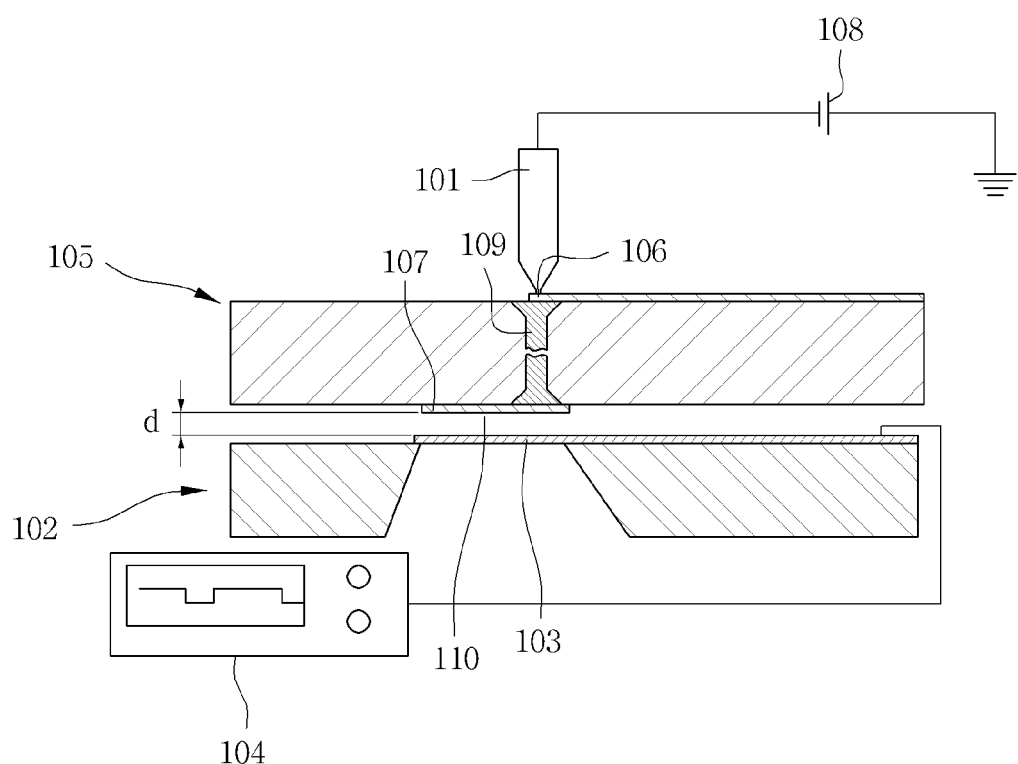
FIG. 4 is a sectional view showing an apparatus for inspecting defects in the circuit pattern of a substrate when an inspection target circuit pattern is not connected to a connection circuit pattern according to an embodiment of the present invention.

FIG. 3 is a sectional view showing an apparatus for inspecting defects in the circuit pattern of a substrate when an inspection target circuit pattern 106 is normally connected to a connection circuit pattern 107 according to the present invention. FIG. 4 is a sectional view showing an apparatus for inspecting defects in the circuit pattern of a substrate when the inspection target circuit pattern 106 is not connected to the connection circuit pattern 107 according to the present invention. Hereinafter, a method of inspecting defects in the circuit pattern of a substrate according to the present invention will be described in detail with reference to the drawings.

First, the pin probe 101 for inputting a voltage while coming into contact with the inspection target circuit pattern 106 of the substrate 105 is prepared. In this case, the conical portion of the pin probe 101 comes into contact with the inspection target circuit pattern 106 and the portion of the pin probe 101 which is opposite the conical portion is connected to the voltage source 108 through a lead wire.

Next, the capacitor sensor 102 is installed so that the membrane electrode 103 provided on the capacitor sensor 102 is opposite the connection circuit pattern 107.

Next, a voltage is input to the inspection target circuit pattern 106 by the pin probe 101.

In this case, when the inspection target circuit pattern 106 is normally connected to the connection circuit pattern 107, the voltage input by the pin probe 101 is transferred to the connection circuit pattern 107, and, as a result, a potential difference between the connection circuit pattern 107 and the membrane electrode 103 is generated. Due to the potential difference, the Coulomb force between the connection circuit pattern 107 and the membrane electrode 103 is generated, so that the membrane electrode 103 is curved towards the connection circuit pattern 107. That is, the displacement of the membrane electrode 103 occurs due to the potential difference.

In contrast, when the inspection target circuit pattern 106 is not connected to the connection circuit pattern 107, there is no potential difference between the membrane electrode 103 and the connection circuit pattern 107, so that the membrane electrode 103 is not curved towards the connection circuit pattern 107, but maintains its original shape. That is, the displacement of the membrane electrode 103 does not occur.

In this case, in order to increase the Coulomb force attributable to the potential difference between the connection circuit pattern 107 and the membrane electrode 103, the size of the membrane electrode 103 is preferably identical to that of the connection circuit pattern 107.

Next, the capacitance of the capacitor attributable to the displacement of the membrane electrode 103 detected by the capacitor sensor 102 is measured.

In detail, as shown in FIG. 3, when the inspection target circuit pattern 106 is normally connected to the connection circuit pattern 107, the membrane electrode 103 is curved towards the connection circuit pattern 107 (that is, the displacement of the membrane electrode 103 occurs) due to the Coulomb force attributable to the potential difference. Accordingly, the distance between the connection circuit pattern 107 and the membrane electrode 103 becomes shorter. In this case, since the capacitance of the capacitor is $$C = \frac{\varepsilon_0 A}{d},$$

and the distance d between the membrane electrode 103, which is the first metal plate of the capacitor, and the connection circuit pattern 107, which is the second metal plate of the capacitor, becomes shorter, capacitance C1 obtained at this time increases.

In contrast, as shown in FIG. 4, when the inspection target circuit pattern 106 is not connected to the connection circuit pattern 107, the distance d between the connection circuit pattern 107 and the membrane electrode 103 does not change, and thus capacitance C2 obtained at this time stays at its original value without change, and has a value comparatively smaller than C1.

Next, whether defects are present in the circuit pattern of the substrate is determined on the basis of the difference in measured capacitance. When the measured capacitance C is identical to C1, it can be determined that the inspection target circuit pattern 106 is normally connected to the connection circuit pattern 107. When the measured capacitance C is identical to C2, it can be determined that the inspection target circuit pattern 106 is not connected to the connection circuit pattern 107.

Meanwhile, the apparatus 100 for inspecting defects in the circuit pattern of a substrate according to the present invention realizes improved effects when the inspection target circuit pattern 106 is connected to the connection circuit pattern 107 through a via 109.

In detail, since the number of circuit patterns formed on the top of the substrate 105, which correspond to the inspection target circuit pattern 106, is generally smaller than the number of circuit patterns formed on the bottom of the substrate, that is, since the density of circuit patterns is low, there is a low possibility of incurring problems caused by contact with the pin probe 101. In contrast, since the density of circuit patterns formed on the bottom of the substrate, which correspond to the connection circuit pattern 107, is high, there is a high possibility of incurring problems caused by contact with the pin probe 101. Therefore, when the apparatus 100 and method for inspecting defects in the circuit pattern of a substrate according to the present invention are used, the pin probe 101 is used on the top of the substrate in a contact manner, and the capacitor sensor 102 is used on the bottom of the substrate in a non-contact manner. Accordingly, the problems of contact methods, such as the concealment of the separation of electrodes or erroneous measurements, can be reduced.

Accordingly, the apparatus and method for inspecting defects in the circuit pattern of a substrate according to the present invention are advantageous in that a capacitor sensor is installed with respect to a connection circuit pattern in a non-contact manner, and the occurrence of defects in the circuit pattern is then measured, thus reducing the occurrence of erroneous measurements caused by the contact pressure of a pin probe (the concealment of the separation of electrodes).

Further, the present invention is advantageous in that, since a capacitor sensor is installed with respect to a connection circuit pattern in a non-contact manner, there is no need to bring a pin probe into contact with unit connection circuit patterns, thus reducing the time required for measurements.

Furthermore, the present invention is advantageous because a pin probe is used only for an inspection target circuit pattern, thus reducing costs incurred by the consumption of parts.

Furthermore, the present invention is configured such that the membrane electrode of a capacitor sensor and a connection circuit pattern are formed to have the same size, so that the potential difference between the membrane electrode and the connection circuit pattern can be maximized, and, as a result, the Coulomb force increases, and thus the displacement of the membrane electrode becomes conspicuous. Accordingly, there is an advantage in that precise measurement using a high signal level is possible.

In addition, the present invention is advantageous in that, when repetitive inspections are performed, all circuit patterns are inspected under the same conditions, thereby improving repeatability/reproducibility and measurement reliability.

Although the preferred embodiments of the present invention have been disclosed for illustrative purposes, those skilled in the art will appreciate that the above embodiments are intended to describe the present invention in detail and the apparatus and method for inspecting defects in the circuit pattern of a substrate according to the present invention are not limited thereto and that various modifications, additions and substitutions are possible, without departing from the scope and spirit of the invention as disclosed in the accompanying claims.

Simple modifications or changes of the present invention belong to the scope of the present invention, and the detailed scope of the present invention will be more clearly understood by the accompanying claims.

What is claimed is:

1. An apparatus for inspecting defects in a circuit pattern of a substrate, comprising:
   a pin probe configured to input a voltage while coming into contact with an inspection target circuit pattern formed on one side of said substrate;
   a capacitor sensor provided with a membrane electrode which is opposite a connection circuit pattern to be electrically connected to the inspection target circuit pattern formed on the other side of the substrate through a via in a non-contact manner, and configured to detect both capacitance and capacitance variation, generated due to displacement of the membrane electrode attributable to electrostatic attractive force acting from the connection circuit pattern on the membrane electrode; and
   a capacitance measurement unit connected to the membrane electrode of the capacitor sensor and the connection circuit pattern, and configured to measure capacitance attributable to the displacement of the membrane electrode, which is input from the capacitor sensor,
   wherein the capacitance measurement unit is to measure capacitance incurred by displacement of the membrane electrode when the membrane electrode is curved towards the connection circuit pattern due to Coulomb force in the case of connecting the inspection target circuit pattern and the connection circuit pattern normally.

2. The apparatus as set forth in claim 1, further comprising a voltage source for applying the voltage to the inspection target circuit pattern through the pin probe.

3. The apparatus as set forth in claim 1, wherein the displacement of the membrane electrode of the capacitor sensor occurs towards the connection circuit pattern due to electrostatic attractive force when the inspection target circuit pattern of the substrate is electrically connected to the connection circuit pattern.

4. The apparatus as set forth in claim 1, wherein the substrate is a printed circuit board or a semiconductor wafer.

5. A method of inspecting defects in a circuit pattern of a substrate, comprising:
   (A) preparing a pin probe which inputs a voltage while coming into contact with an inspection target circuit pattern formed on one side of a substrate;
   (B) disposing a capacitor sensor on the substrate so that a membrane electrode provided on the capacitor sensor is opposite a connection circuit pattern to be electrically connected to the inspection target circuit pattern formed on the other side of the substrate through a via formed in the substrate in a non-contact manner; and
   (C) inputting the voltage to the inspection target circuit pattern of the substrate through the pin probe, and measuring capacitance attributable to displacement of the membrane electrode detected by the capacitor sensor when the membrane electrode is curved towards the connection circuit pattern due to Coulomb force in the case of connecting the inspection target circuit pattern and the connection circuit pattern normally.

6. The method as set forth in claim 5, further comprising:
   (D) determining based on a difference in the measured capacitance whether defects are present in the circuit pattern of the substrate.

7. The method as set forth in claim 5, wherein a capacitor of the capacitor sensor comprises two conductor films respectively implemented as the membrane electrode and the connection circuit pattern, and a dielectric implemented as an air layer between the membrane electrode and the connection circuit pattern.

8. The method as set forth in claim 5, wherein the substrate is a printed circuit board or a semiconductor wafer.

* * * * *